(12) United States Patent
Orr

(10) Patent No.: US 6,680,641 B1
(45) Date of Patent: Jan. 20, 2004

(54) BIDIRECTIONAL BIPOLAR TRANSISTOR SWITCH ARRANGEMENT

(75) Inventor: Bruce Francis Orr, Balgowlah (AU)

(73) Assignee: Alcatel, Paris (FR)

(*) Notice: Subject to any disclaimer, the term of this patent is extended or adjusted under 35 U.S.C. 154(b) by 0 days.

(21) Appl. No.: 10/168,509
(22) PCT Filed: Aug. 24, 2000
(86) PCT No.: PCT/AU00/00994
§ 371 (c)(1),
(2), (4) Date: Sep. 9, 2002
(87) PCT Pub. No.: WO01/28095
PCT Pub. Date: Apr. 19, 2001

(30) Foreign Application Priority Data

Dec. 23, 1999 (AU) .............................. PQ 4806

(51) Int. Cl.⁷ ..................... H01L 29/73; H01L 27/082
(52) U.S. Cl. ...................................... 327/432
(58) Field of Search ................. 327/432, 439, 327/462, 575

(56) References Cited

U.S. PATENT DOCUMENTS

| | | | | |
|---|---|---|---|---|
| 4,072,981 A | * | 2/1978 | Black et al. | 257/570 |
| 4,924,341 A | * | 5/1990 | Culp et al. | 361/56 |
| 5,006,734 A | * | 4/1991 | Engelbrecht | 327/322 |
| 5,349,242 A | | 9/1994 | Tanaka et al. | |
| 5,418,834 A | * | 5/1995 | Byatt et al. | 327/484 |
| 5,493,134 A | * | 2/1996 | Mehrotra et al. | 257/132 |
| 5,608,237 A | | 3/1997 | Aizawa et al. | |

* cited by examiner

Primary Examiner—Timothy P. Callahan
Assistant Examiner—Terry L. Englund
(74) Attorney, Agent, or Firm—Sughrue Mion, PLLC

(57) ABSTRACT

A bidirectional bipolar transistor switch for use in customer end telecommunications equipment connected to a telephone line whose line feed polarity can be either positive or negative, for switching low level AC signals. A pair of bipolar transistors are connected in anti-parallel and are operated by a common current sensing resistor in the base/emitter circuit of both transistors. The transistors operate with no DC bias on the collector, and both forward and reverse conductor modes are used.

12 Claims, 3 Drawing Sheets

BIDIRECTIONAL BIPOLAR TRANSISTOR SWITCH ARRANGEMENT

FIELD OF INVENTION

This invention relates to a bidirectional bipolar transistor switch arrangement for use in customer end telecommunications equipment connected to a telephone line whose line feed polarity can be either positive or negative. In such communications equipment it may be necessary to provide a line powered switch to switch low level AC signals to an ancillary circuit element, when the telephone line current is present.

For such a purpose it is known to use contacts of an electromagnetic relay whose coil is incorporated in the telephone line loop. Such an arrangement is described in our co-pending Australian Pat. Appl. No. 36813/99, in which contacts of a line current sensing relay cause a capacitor to be inserted into a filter when an associated telephone is brought into an off-hook mode, to alter the characteristics of the filter.

There are, however, several disadvantages associated with relays, including reed relays, when used for this purpose. A major disadvantage is that such relays are barely sensitive enough for reliable operation at low current values, typically 20 to 50 mA. This is because the relay coil is serially connected in the line loop and its coil resistance therefore needs to be relatively low. Consequently the number of turns in the coil is small. Another disadvantage is that of contact unreliability. Further, the fast rise time of current when the contacts of the relay close may cause errors in some forms of signal transmission such as ADSL transmission.

It is also known to use JFET transistors for switching AC signals. While the drain/source of a JFET transistor is capable of conducting current in both directions, a control voltage must be applied to the transistor's gate of a polarity that matches the JFET type (P-channel, N-channel). Generating a unipolar control voltage when the line feed polarity can be either positive or negative is difficult. Although two JFETs could be used, the relatively high turn-on voltage of JFETs make them less attractive for this application.

Another known AC switch is an optically coupled MOS switch, sometimes known as a MOS optocoupler. While this type of switch can also handle low level AC signals, its operating LED is typically unipolar which requires a rectifier bridge if the device is to operate with a line-feed polarity of either polarity. Such a rectifier bridge is disadvantageous in that it introduces a relatively high voltage drop. Further, this type of switch is relatively expensive.

SUMMARY OF INVENTION

It is therefore an object of the present invention to provide a low cost bidirectional line powered bipolar transistor switch arrangement that can reliably operate at low current values, and can operate with a line-feed polarity of either polarity without the need for a polarity guard.

According to the invention there is provided a bidirectional bipolar transistor switch arrangement comprising a current sensing resistance means of predetermined value connected between a first node and a second node, a first bipolar transistor whose base element is connected to said first node and whose emitter element is connected to said second node, and a second bipolar transistor whose base element is connected to said second node and whose emitter element is connected to said first node, the first and second bipolar transistor's respective collector elements being connected together at a third node, said switch arrangement's connection means being formed by said second node and said third node, whereby when direct current is caused to flow between said first node and said second node through said current sensing resistance means to produce a voltage across the first and second nodes of a magnitude such that, depending on its polarity, either said first transistor or said second transistor is turned on thereby in a forward and reverse conduction mode, thereby providing an AC conducting path between said connection means via the turned on transistor's emitter/collector junction.

BRIEF DESCRIPTION OF DRAWINGS

In order that the invention may be readily carried into effect embodiments thereof will now be described in relation to the accompanying drawings, in which.

DETAILED DESCRIPTION

Figure 1:
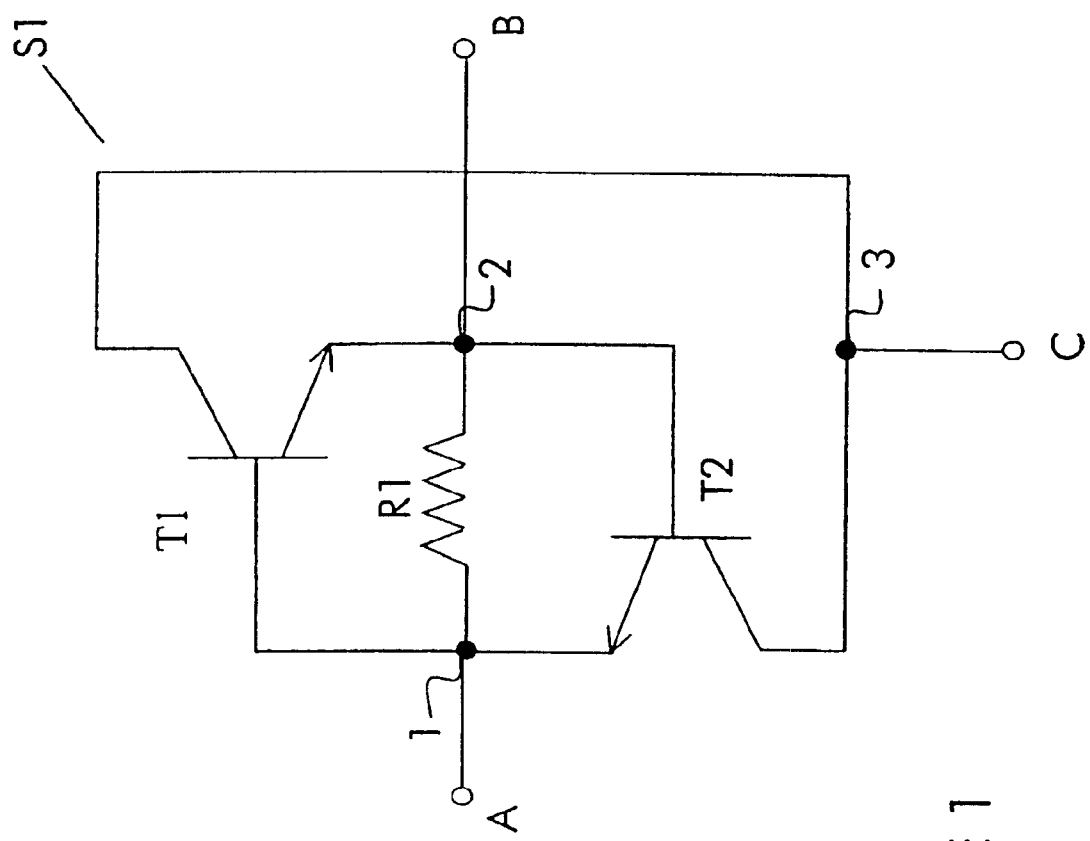
FIG. 1 shows a schematic circuit diagram of the bipolar transistor switch arrangement of the present invention.

Referring to FIG. 1, the switch arrangement S1 of the present invention comprises two NPN transistors T1 and T2, a current sensing resistor R1, and three circuit connecting nodes 1,2 and 3 respectively connected to three switch connecting points A, B and C.

It will be understood that PNP transistors could be substituted for the NPN transistors shown.

Figure 2:
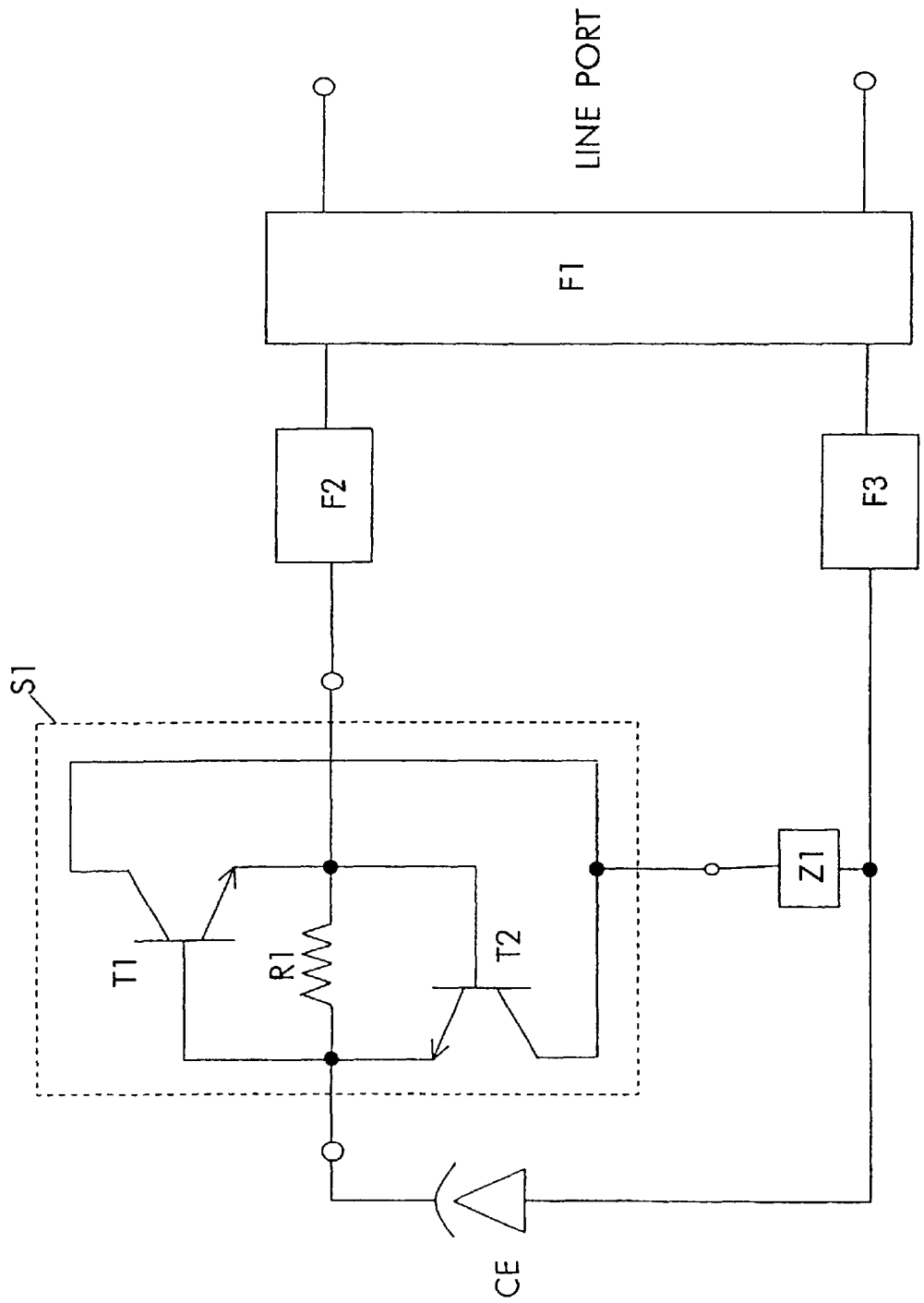
FIG. 2 shows a schematic circuit diagram of an ADSL in-line filter incorporating the bipolar switch arrangement of the present invention.

Referring to FIG. 2, Customer Equipment (CE) eg, a telephone is connected to an ADSL line port L1–L2 via an in-line filter arrangement comprising a second order filter F1 and two series impedance correction stages F2 and F3. A shunt impedance stage Z1 is switched into circuit by switch arrangement S1 of the present invention when telephone CE is brought into the off-hook mode causing loop current to flow through the current sensing resistor R1. The operation of the in-line filter and its associated shunt impedance stage Z1 is described in the specification of our co-pending Australian Patent Application No. 54014/99. For example, the shunt impedance stage Z1 can be a complex impedance network, or a capacitor.

The operating current threshold of the switch arrangement S1 is determined by the value of resistor R1. With a typical resistance of 120 ohms this current threshold is approximately 5 mA which produces a voltage drop of 0.6 volts. This voltage drop turns on either transistor T1 or transistor T2 depending on the polarity of the loop current. It should be noted that only one of the transistors is active for a given loop current polarity.

The active transistor is operated in an unusual mode in that there is no DC current in the collector, and both forward and reverse conduction modes are used. In the reverse conduction mode a negative collector voltage, with respect to emitter voltage, enables a negative current flow from collector to emitter (conventional current flow is from emitter to collector). This reverse conduction is necessary to conduct the negative part of an AC signal switched through the active transistor to the shunt impedance stage Z1. In order to ensure that the active transistor can conduct at least 2 mA of AC signal while remaining in saturation a relatively large base current is supplied by choosing the value of sensing resistor R1 to provide a base current of approximately 1 mA at loop currents above 10 mA.

Figure 3:
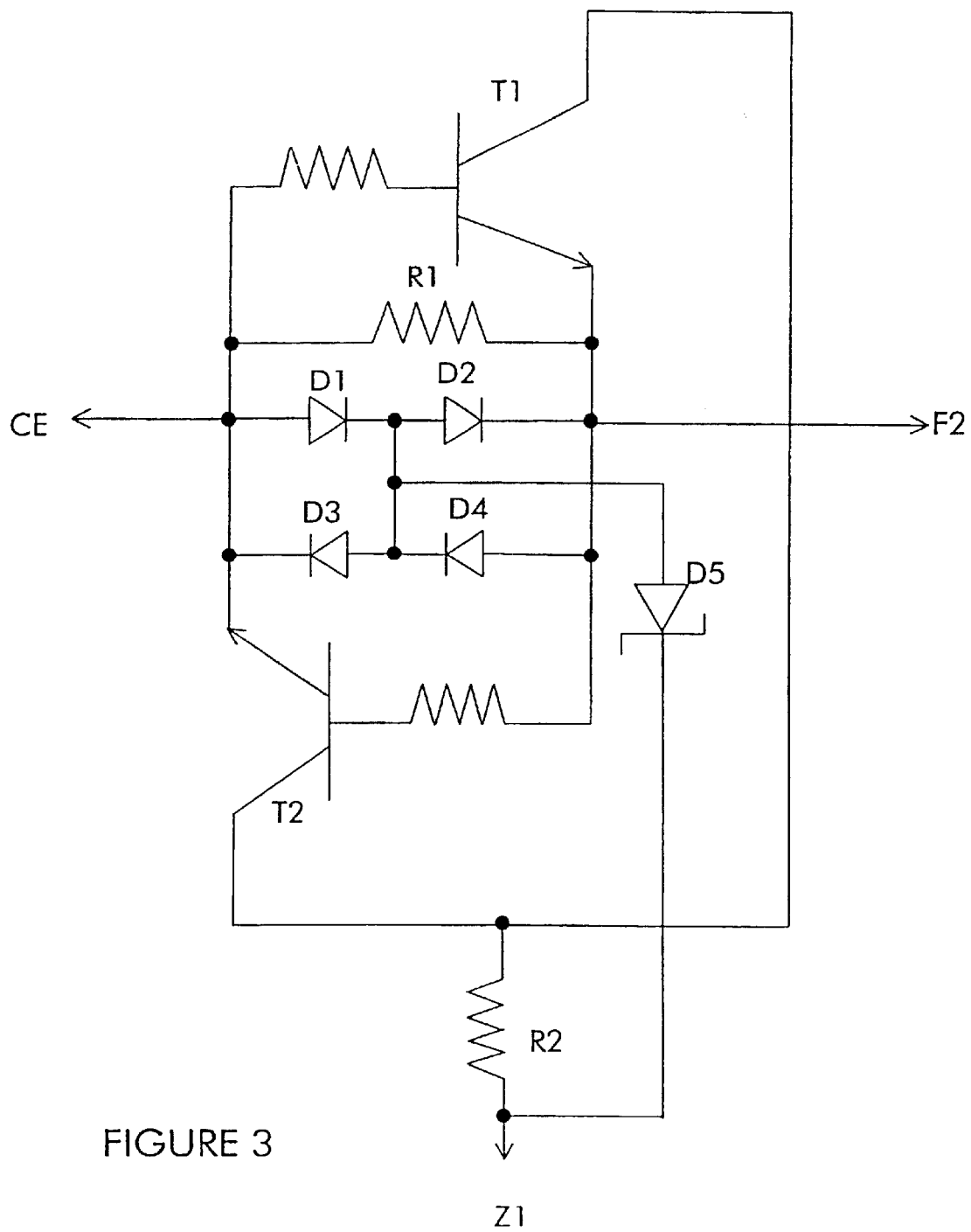
FIG. 3 shows a further embodiment of the switch arrangement shown in FIG. 1.

Referring to FIG. 3, the switch arrangement in this preferred embodiment includes a high voltage protection circuit in the form of a pair of serially connected diodes D1–D2 operatively connected across the base/emitter elements of transistor T1, a pair of diodes D3–D4 similarly connected across the base/emitter elements of transistor T2, and a zener diode D5 operatively connected to the collectors of the transistors.

Diodes D1, D2, D3 and D4 are arranged to protect the base/emitter circuits of the transistors, and diode D5, which is a surge arrestor type zener, is arranged to protect the collectors of the transistors.

The switch arrangement of the present invention may be integrated into a module with the in-line filter elements to be interposed between the telephone and the line port.

Alternately, the switch arrangement elements and the in-line filter elements can be incorporated in the telephone.

The switch arrangement of the present invention may be used in other customer equipment such as, for example, facsimile equipment.

A plurality of switch arrangements of the present invention may be adapted to switch a plurality of circuit elements in a circuit arrangement.

The claims defining the invention are as follows:

1. A bidirectional bipolar transistor switch arrangement comprising a current sensing resistance means of predetermined value connected between a first node and a second node, a first bipolar transistor whose base element is connected to said first node and whose emitter element is connected to said second node, and a second bipolar transistor whose base element is connected to said second node and whose emitter element is connected to said first node, the first and second bipolar transistor's respective collector elements being connected together at a third node, said switch arrangement's connection means being formed by said second node and said third node, whereby when direct current is caused to flow between said first node and said second node through said current sensing resistance means to produce a voltage across the first and second nodes of a magnitude such that, depending on its polarity, either said first transistor or said second transistor is turned on thereby in a forward and reverse conduction mode, thereby providing an AC conducting path between said connection means via the turned on transistor's emitter/collector junction.

2. A bidirectional bipolar switch arrangement as claimed in claim 1, wherein said direct current is loop current of a telephone line.

3. A bidirectional bipolar switch arrangement as claimed in claim 1, wherein said AC conducting path provided by said turned on transistor switches at least one circuit element.

4. A bidirectional bipolar switch arrangement as claimed in claim 3, wherein said at least one circuit element comprises a complex impedance network.

5. A bidirectional bipolar switch arrangement as claimed in claim 3, wherein said at least one circuit element is a capacitor.

6. A bidirectional bipolar switch arrangement as claimed in claim 1, wherein said first transistor and said second transistor are of the NPN type.

7. A bidirectional bipolar switch arrangement as claimed in claim 1, wherein said first transistor and said second transistor are of the PNP type.

8. A bidirectional bipolar switch arrangement as claimed in claim 1, including voltage protection means.

9. An ADSL in-line filter arrangement operatively incorporating at least one bidirectional bipolar switch arrangement as claimed in claim 1.

10. An ADSL in-line filter arrangement as claimed in claim 9, incorporated in customer equipment means.

11. An ADSL in-line filter arrangement as claimed in claim 10, wherein said customer equipment means is a telephone.

12. An ADSL in-line filter arrangement as claimed in claim 10, wherein said customer equipment means is a facsimile device.

* * * * *